United States Patent [19]

Hosaka

[11] Patent Number: 5,233,288
[45] Date of Patent: Aug. 3, 1993

[54] IC BUILT-IN CONNECTOR FOR POWER SOURCE STABILIZATION HAVING VOLTAGE CONTROL RESISTORS IN HEATING PROXIMITY TO THE IC

[75] Inventor: Taiji Hosaka, Tokyo, Japan

[73] Assignee: Yamachi Electric Co., Ltd., Tokyo, Japan

[21] Appl. No.: 824,519

[22] Filed: Jan. 23, 1992

[30] Foreign Application Priority Data

Jan. 23, 1991 [JP] Japan .................................. 3-24202

[51] Int. Cl.⁵ .......................... G05F 1/46; G05F 1/56
[52] U.S. Cl. .................................... 323/273; 323/907
[58] Field of Search ................ 323/234, 273, 281, 907

[56] References Cited

U.S. PATENT DOCUMENTS

4,445,083  4/1984  DeFalco ............................. 323/273

FOREIGN PATENT DOCUMENTS

104115  5/1988  Japan .
245808  10/1990 Japan .

OTHER PUBLICATIONS

Roberts, "High Power ICS for D.C. Regulating Circuits," New Electronics (G.B.) vol. 11, No. 6, pp. 32–34, Mar. 21, 1978.
"PSU's on PCB's", Elektor (U.K.), vol. 5, No. 3, pp. 3-36 to 40, Mar. 1979.
Venditti, "Reducing the Dropout Voltage of Programmable Regulators," Electronics, vol. 52, No. 21, pp. 154–155, Oct. 11, 1979.

Primary Examiner—William H. Beha, Jr.
Attorney, Agent, or Firm—Wenderoth, Lind & Ponack

[57] ABSTRACT

An IC built-in connector for power source stabilization including a connector body having a plurality of contacts to be brought into contact with a cable terminal connector, and a wiring board built in the connector body and adapted to have thereon a variable direct voltage converter acting as a power source stabilizing IC. The wiring board has a plurality of output voltage control resistors for the power source stabilizing IC having coefficients of temperature which are generally equal, and the resistors are arranged right under or proximate to a surface of the wiring board where the power source stabilizing IC is mounted, so as to be heated equally thereby, so that a resistance ratio of each IC output voltage control resistor is equally compensated with respect to the temperature of the power source stabilizing IC.

3 Claims, 4 Drawing Sheets

F I G. 2
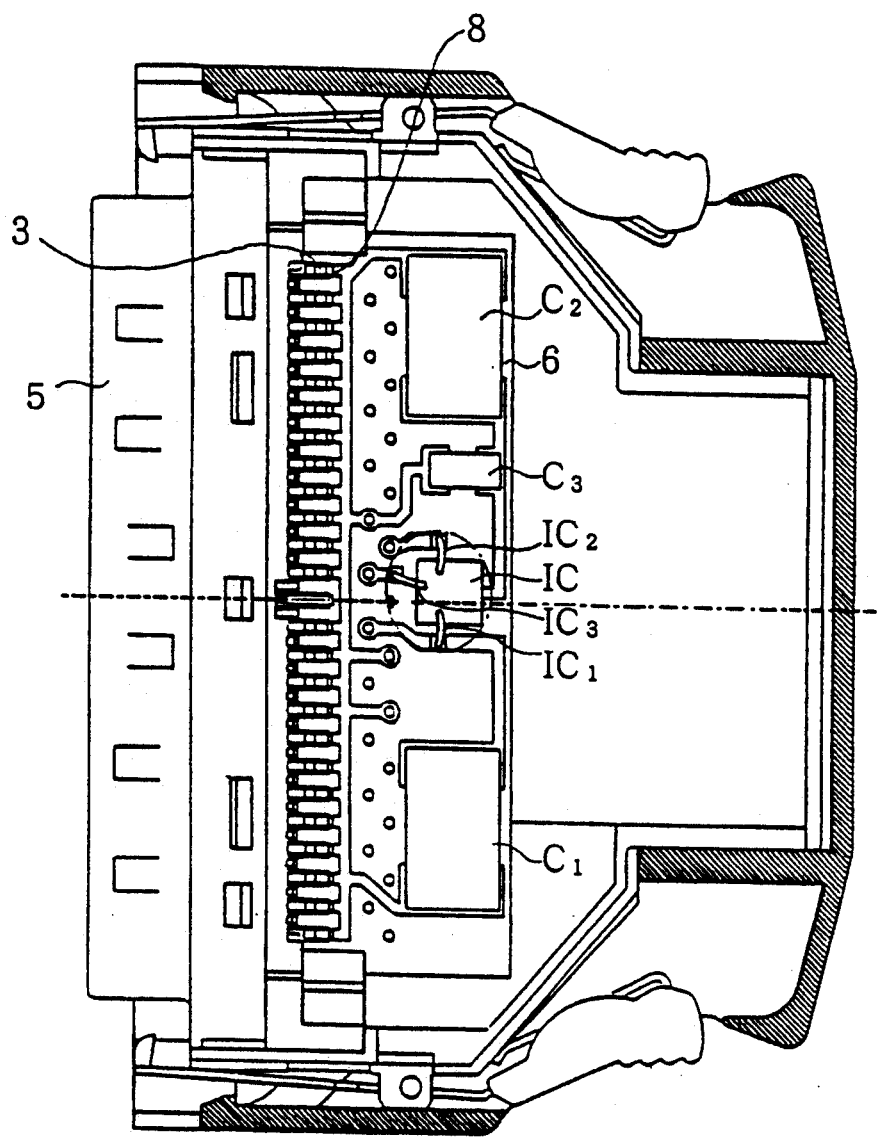
F I G. 3
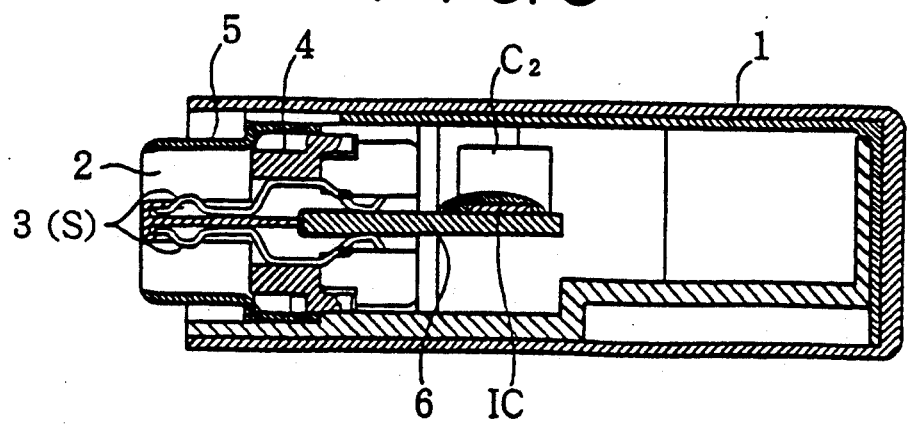

5,233,288

IC BUILT-IN CONNECTOR FOR POWER SOURCE STABILIZATION HAVING VOLTAGE CONTROL RESISTORS IN HEATING PROXIMITY TO THE IC

BACKGROUND OF THE INVENTION

1. Field of the Invention

This invention relates to a power source stabilizing connector including a wiring board built thereto and having a variable direct voltage converter (power source stabilizing IC) mounted thereon, the connector being used in personal computers and peripheral devices thereof.

2. Description of the Prior Art

The conventional power source stabilizing connector of this type includes a connector body having a plurality of contacts to be brought into contact with a cable terminal connector, and a wiring board built into the connector body and adapted to have thereon a variable direct voltage converter (power source stabilizing IC) as a power source stabilizing element, the wiring board, as shown in FIG. 1, having a number of output matching resistors Rl through Rn connected to an output terminal IC2 of the power source stabilizing IC and two IC output voltage control resistors R1 connected to the output terminal IC2 and voltage control terminal IC3 of the IC, the output resistors matching Rl through Rn and IC output voltage control resistors R1 being formed on the wiring board by means of printed wire, the contacts Sl through Sn being connected to the output matching resistors so as to be connected with the cable terminal connector. The reference numeral C3 denotes an input side noise removing condenser which is connected to the input terminal IC1 of the power source stabilizing IC1, and C1 and C2 respectively denote output side noise removing condensers which are respectively connected to the output terminal in parallel with the IC output voltage control resistors R'1 and the output matching resistors Rl through Rn.

The power source stabilizing IC forming the variable direct voltage converter has a variable output voltage depending on resistance values of the voltage control resistors, and it is necessary to install the above resistors for setting an output voltage. However, the power source stabilizing IC generates heat depending on the output voltage, and thermal affects to the resistors, etc. owing to generation of the heat which is unavoidable. Especially, the resistance values of the IC output voltage control resistors are varied due to temperature change, and this in turn causes each resistance ratio to vary. As a result, output voltage of the power source stabilizing IC is varied by an amount exceeding an allowable limit, and reliability is lowered.

SUMMARY OF THE INVENTION

It is therefore an object of the present invention to provide an IC built-in connector for power source stabilization which is capable of effectively preventing variation of resistance ratios of output voltage control resistors caused by generation of heat in a power source stabilizing IC and obviating the above-mentioned problem of output voltage variation of the power source stabilizing IC caused by variation of the resistance ratios by a very simple means.

As this means, an IC built-in connector for power source stabilization according to the present invention is designed such that temperature coefficients of resistance of respective IC output voltage control resistors are arranged to be generally equal, and the resistors are arranged right under or proximate to a surface of a wiring board where a power source stabilizing IC is mounted, so that a resistance ratio of each IC output voltage control resistor is compensated with respect to the temperature to which a power source stabilizing IC is heated.

As the above-mentioned means for preventing variation of resistance ratios of the IC output voltage control resistors caused by generation of heat in the power source stabilizing IC, there can be contemplated an arrangement in that instead of arranging the resistors on the wiring board where the power source stabilizing IC is mounted, they are arranged in a place thermally isolated therefrom. However, this arrangement makes the connector large in size. Furthermore, much time and labor for manufacture as well as cost increase are inevitable. Therefore, this idea is not practical to employ. On the other hand, a simple re-arrangement of the IC output voltage control resistors and a group of other resistors for efficiently arranging them on a printed wiring board, gives rise to the above-mentioned problem caused by IC heating.

The present invention was made based on a process of thought contrary to that of the above. That is, in the present invention, the IC output voltage control resistors are arranged proximate to and preferably right under the power source stabilizing IC which also acts as a heat source, so that the resistors will receive a generally equivalent amount of heat from the heat source IC). As a result, the resistance value of the respective IC output voltage control resistors are always and generally equivalently varied, and mutual resistance ratios are transited generally equally. Accordingly, the problem of output variation of the power source stabilizing IC can be surely obviated by a very simple means.

BRIEF DESCRIPTION OF THE DRAWINGS

FIG. 2 is a sectional top plan view showing an internal structure of an IC built-in connector for power source stabilization according to one embodiment of the present invention;

FIG. 3 is a sectional side view showing an internal structure of the above connector;

FIG. 6 is a plan view of a wiring board in which FIGS. 4 and 5 are compositely shown;

DETAILED DESCRIPTION OF THE EMBODIMENT

Figure 1:
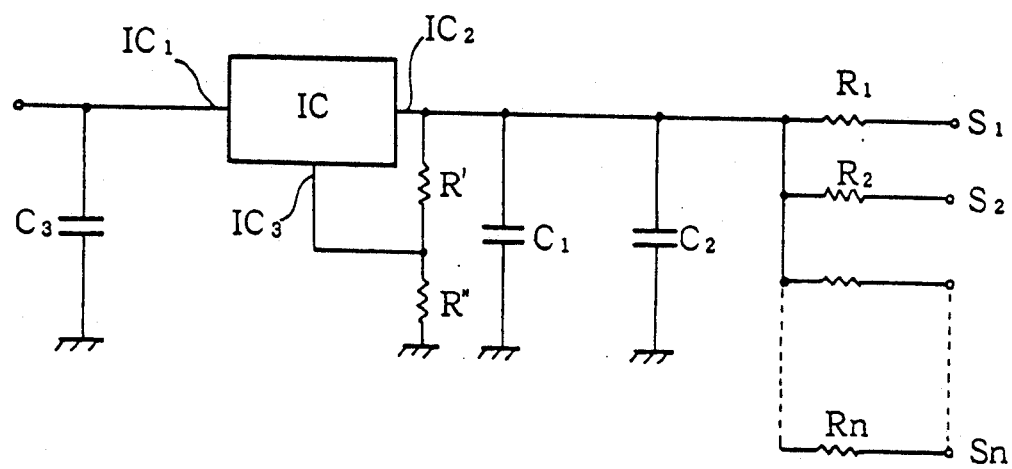
FIG. 1 is a circuit diagram of a wiring board to be built in an IC built-in connector for power source stabilization.
Figure 4:
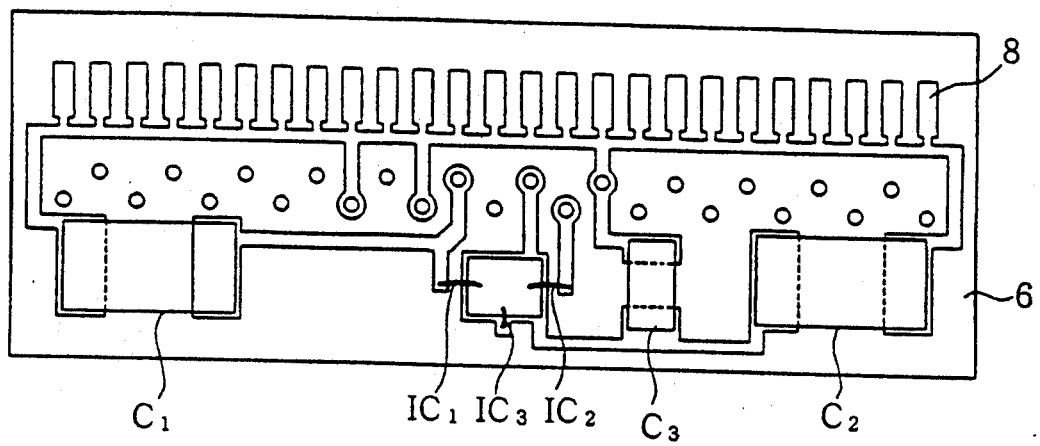
FIG. 4 is a plan view of a wiring board built in the above connector, when viewed from the side having the surface where a power source stabilizing IC is mounted.
Figure 5:
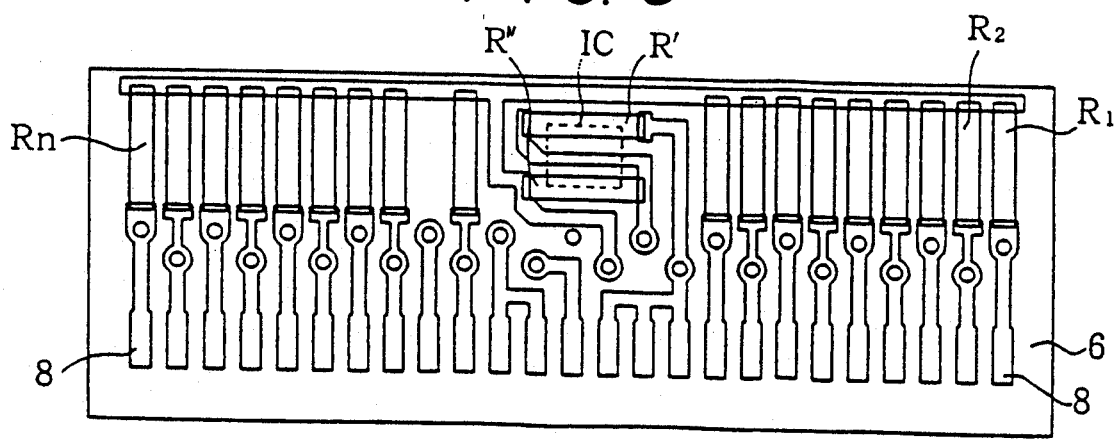
FIG. 5 is a plan view of the above wiring board when viewed from the side having the surface opposite the IC-mounted surface.
Figure 6:
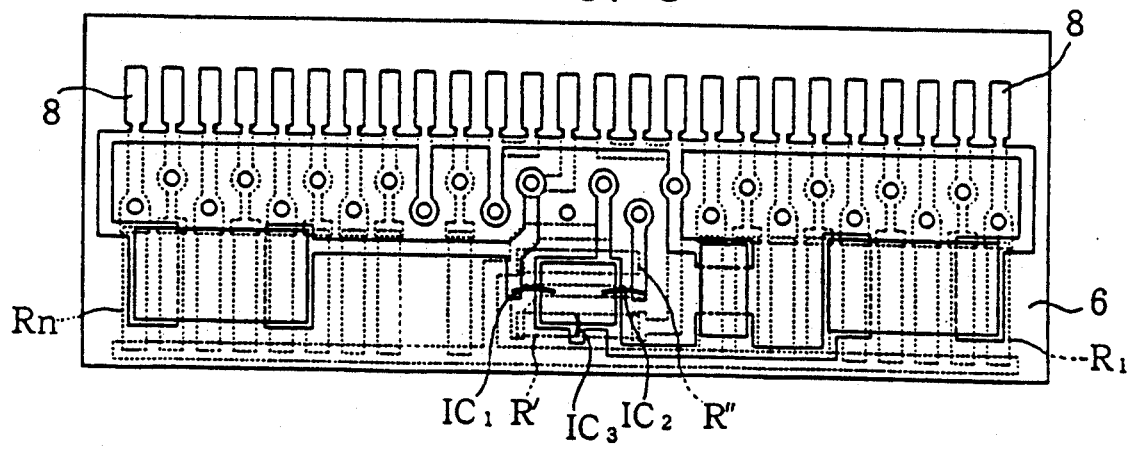
Figure 7:
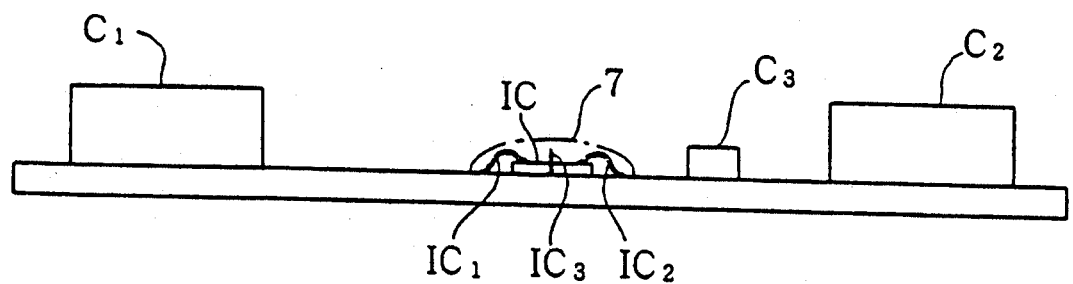
FIG. 7 is a front view of the above wiring board.
Figure 8:
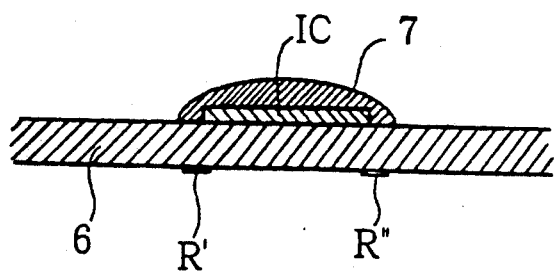
FIG. 8 is a sectional view of an important part showing an arrangement of a power source stabilizing IC and output voltage control resistors.

As is shown in FIGS. 2 and 3, a hollow connector body 1 has a connecting port 2 at a front end face thereof, and a number of contact arranged in parallel relation within the connecting port 2 and adapted to be brought into contact with a cable terminal connector (not shown).

The contacts 3 are arranged such that two elongated resilient contact pieces are placed in a parallel pair relation, and a number of such parallel pairs are implanted in a rectangular insulating block 4 and held within the connecting port 2. One end of each contact 3 is exposed outside within the connecting port 2 to form a connecting piece with the cable terminal connector, and a group of such contacting pieces are surrounded with a metal shell 5 to define the connecting port 2. On the other hand, the other end of each contact is allowed to project within the connector body 1 to form a pair of clip-shaped pieces which are adapted to clip onto a wiring board 6, as will be described, for connection. The contacts 3 correspond to contact S1 through Sn in FIG. 1.

One surface of the wiring board 6, as shown in FIGS. 4 through 7, has a variable direct voltage converter (hereinafter referred to as "IC for power source stabilization" or "power source stabilizing IC") mounted on a generally central portion thereof, and condensers C1, C2 and C3 which are spacedly mounted sideward of the power source stabilizing IC. Furthermore, the wiring board 6 has a number of output matching resistors R1 through Rn for the power source stabilizing IC which are wire printed on the opposite surface, and a plurality of output voltage control resistors R', R" of the power source stabilizing IC, which are also wire printed the opposite surface.

The output matching resistors R1 through Rn are arranged in order from one end to the other end on the opposite surface of the wiring board 6 from the IC-mounted surface, and a group of terminals 8 of the resistors R1 through Rn are orderly arranged on the surface of the wiring board along the longitudinal edge portion thereof. By clipping the edge portion of the wiring board 6 where the terminals 8 are arranged with a clip-shaped contacting piece formed on the inner end of each contact 3, the contact 3 is brought into contact with each of resistors R1 through Rn through the terminal 8. At the same time, the respective pairs of contacts 3 are fixed to the terminals 8 by solder and connected thereto in parallel relation through a conductive path which is wire printed on the wiring board to the output terminal IC2 of the power source stabilizing IC.

On the other hand, the IC output voltage control resistors R1 are arranged right under or proximate to the power source stabilizing IC and are connected to the output terminal IC2 of the power source stabilizing IC through a conductive path which is wire printed on the wrong board to the voltage control terminal IC3 in accordance with the circuit of FIG. 1.

As one example, the IC output voltage control resistors R1, as shown in FIGS. 4 through 8, are wire printed on the opposite surface of the wiring board 6 with respect to the IC-mounted surface thereof so that they are arranged right under or proximate to the power source stabilizing IC.

Figure 9:
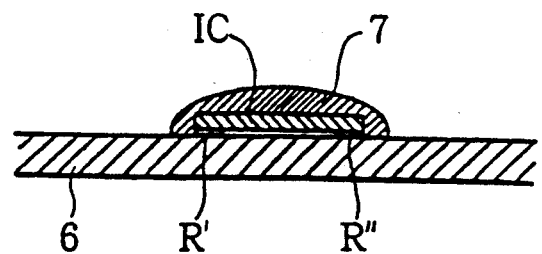
FIG. 9 is a sectional view of an important part showing another example.

As another example, the IC output voltage control resistors R'1, as shown in FIG. 9, are wire printed on the IC-mounted surface of the wiring board 6, and they are contacted with a bottom surface of the IC or with a seal material 7 as will be described, so that they are arranged right under or proximate to the power source stabilizing IC. That is, the power source stabilizing IC and the IC output voltage control resistors R'1 are embedded in the seal material 7.

The power source stabilizing IC used in this embodiment is a non-packaged IC chip called a "bear-chip". This bear chip is connected to a wire pattern by respective terminals IC1, IC2 and IC3 which are formed of a thin wire, and its surface is coated with a synthetic resin material (seal material) 7 as an insulating material so that it can be fixed to the wiring board and protecting by hardening the resin material. The IC output voltage control resistors R', are arranged such that a whole or a part of the resistors R', are located on the area where the seal material 7 is applied. The power source stabilizing IC as a heating element is sealed with the seal material 7, and heat of the IC is positively transmitted to the IC-mounted surface side, so that the IC output voltage control resistors R1, which are arranged in the area where the IC is mounted, may be directly heated by the IC heat at that time. By this, the power source stabilizing IC and the IC output voltage control resistors R1 can be placed under the same thermal condition.

As described above, the output voltage of the power source stabilizing IC is varied by setting reference voltage between the output terminal IC2 and voltage control terminal IC3, and this reference voltage uses the bias voltage of resistors R, R'1. Accordingly, to set the output voltage of the IC, installation of two resistors R'1, are necessary and it is required to vary the resistance ratios by selecting resistance values thereof.

However, the power source stabilizing IC generates heat of, in a general example, about 100 degrees maximum and about 60 degrees minimum, and the difference is almost 40 degrees which is in a range in which the thermal affect with respect to the conventional resistors R", R". According to the present invention, the resistors R", R" are properly arranged, as mentioned above, to effectively utilize this heat in order to obtain resistance ratios thereof, to thereby stabilize the IC output voltage.

As described in the foregoing, according to the present invention, the respective IC output voltage control resistors are generally equivalently varied in resistance value caused by generation of heat in the power source stabilizing IC, and the mutual resistance ratios are always and generally equally transited. As a result, there can be provided a highly reliable IC built-in connector for power source stabilization, which is capable of effectively overcoming variation of output voltage of power source stabilizing IC and stabilizing the output voltage.

Furthermore, simply by arranging the respective resistors on the wiring board without substantially changing the conventional structure and by satisfying the requirement of a small size of the structure, the problems inherent in the prior art can be obviated by the very simple means described above.

What is claimed is:

1. An IC built-in connector for power source stabilization including a connector body having a plurality of contacts to be brought into contact with a cable terminal connector, and a wiring board built in said connector body and having thereon a variable direct voltage converter constituted by a power source stabilizing IC, said wiring board being wire printed with a number of output matching resistors of said power source stabilizing IC and a plurality of output voltage control resistors for said power source stabilizing IC, said contacts being connected with said output matching resistors, the temperature coefficients of resistance of said respective IC output voltage control resistors being generally equal, and said resistors being positioned right under or proximate to a surface of said wiring board where said power source stabilizing IC is mounted, so that a resistance ratio of each IC output voltage control resistor is compensated with respect to the temperature of said power source stabilizing IC.

2. An IC built-in connector for power source stabilization as claimed in claim 1, wherein said IC output voltage control resistors are positioned in area where a seal material for sealing said power source stabilizing IC is applied.

3. An IC built-in connector for power source stabilization as claimed in claim 1, wherein said IC output voltage control resistors are embedded in said seal material.

* * * * *